US007181836B2

(12) United States Patent
Tsakalakos

(10) Patent No.: US 7,181,836 B2
(45) Date of Patent: Feb. 27, 2007

(54) METHOD FOR MAKING AN ELECTRODE STRUCTURE

(75) Inventor: Loucas Tsakalakos, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 299 days.

(21) Appl. No.: 10/742,036

(22) Filed: Dec. 19, 2003

(65) Prior Publication Data

US 2005/0133254 A1 Jun. 23, 2005

(51) Int. Cl.
*H05K 3/02* (2006.01)
*H05K 3/10* (2006.01)

(52) U.S. Cl. ............................ 29/846; 29/847; 29/849; 29/850; 174/261; 360/322; 365/158; 977/895; 977/932

(58) Field of Classification Search .................. 29/846, 29/847, 849, 850; 174/261; 360/322; 365/158; 977/895, 932

See application file for complete search history.

(56) References Cited

U.S. PATENT DOCUMENTS

| | | | | |
|---|---|---|---|---|
| 6,440,637 | B1 | 8/2002 | Choi et al. | |
| 6,444,256 | B1 | 9/2002 | Musket et al. | |
| 2002/0126742 | A1 | 9/2002 | Rick et al. | |
| 2002/0158342 | A1 | 10/2002 | Tuominen et al. | |
| 2002/0171029 | A1 | 11/2002 | Wolff | |
| 2003/0072885 | A1 | 4/2003 | Lee et al. | |
| 2003/0121764 | A1 | 7/2003 | Yang et al. | |
| 2004/0264064 | A1* | 12/2004 | Sakakima | 360/322 |
| 2005/0138804 | A1* | 6/2005 | Hasegawa et al. | 29/847 |

* cited by examiner

*Primary Examiner*—A. Dexter Tugbang
*Assistant Examiner*—Tim Phan
(74) *Attorney, Agent, or Firm*—Fletcher Yoder

(57) ABSTRACT

An electronic device such as a sensor or a NEMS. The electronic device comprises at least one substrate; a plurality of electrodes disposed on the substrate; and at least one nano-wire growing from an edge of a first electrode to an edge of a second electrode. A method for making an electrode structure by providing a substrate; forming a plurality of electrodes on the substrate; growing at least one nano-wire from the edge of a first electrode; and connecting the at least one nano-wire to the edge of a second electrode is also disclosed.

19 Claims, 4 Drawing Sheets

20
70
180
70
40
60
100
140
120
80

METHOD FOR MAKING AN ELECTRODE STRUCTURE

BACKGROUND OF INVENTION

This invention relates to an electronic device, such as a sensor or a nano-electromechanical system (NEMS). More particularly, the invention relates to a method of integrating inorganic nano-wires with micron sized electrode structures.

As device structures become increasingly miniaturized, the integration of nano-building blocks, such as nano-wires, with a nano-device is of great interest. As the size of device structures decrease, such integration becomes increasingly complex. Inorganic wires, often chosen for applications in devices due to their low work function, high frequency, or quantum transport properties, are independently synthesized by techniques such as vapor transport, laser ablation, or electrochemical filling of porous anodic alumina templates. The inorganic wires are then assembled onto a final substrate or device of interest using techniques such as random dispersion, micro-fluidics, or nano imprint lithography.

One problem associated with separate assembly in the integration of nano-wires and devices is the difficulty in scaling up the involved processes, as many of such assembly steps and processes are distinct from each other. While hybrid integration strategies enable scaling up and quickening of some processes, a method of direct horizontal integration of the nano-wire with the device architecture of interest is highly desirable in microelectronics processing and device fabrication.

The current methods for integrating a nano-wire and a nano-device do not enable direct integration in minimal turnaround times nor in high yield. Therefore, what is needed is an electronic device that is directly integrated with its attendant nano-wires. What is also needed is a method for direct integration of nano-wire and nano-device assembly that is applicable to a variety of nano-wire material compositions and applications. What is also needed is an assimilation of the direct integration method into existing micro and nanotechnology and in micro- and nano-lithography techniques.

BRIEF SUMMARY OF THE INVENTION

The present invention meets these and other needs by providing a method for making an electrode structure comprising at least one substrate, a plurality of electrodes disposed on the substrate, and at least one nano-wire originating from an edge of a first electrode and extending to an edge of a second electrode. An electronic device, such as a nano-electromechanical system (NEMS), transistor, photodetector, light emitting diode, super-conducting device, sensor, and the like that incorporates the electrode structure described above, is also provided.

Accordingly, one aspect of the invention is to provide an electronic device. The electronic device comprises: at least one substrate; a plurality of electrodes, wherein the plurality of electrodes are disposed on the substrate; and at least one nano-wire wherein the nano-wire grows from an edge of a first electrode to an edge of a second electrode.

A second aspect of the invention is to provide an electrode structure. The electrode structure comprises: at least one electrode, the at least one electrode having at least one edge portion; and at least one nano-wire originating from the edge portion.

A third aspect of the invention is to provide an electronic device. The electronic device comprises: at least one substrate, the at least one substrate comprising at least one of a semi-conducting material, an insulating material, and combinations thereof; and an electrode structure disposed on the substrate. The electrode structure comprises a plurality of electrodes and at least one nano-wire, wherein the nano-wire originates from an edge portion of a first electrode and extends to an edge of a second electrode.

A fourth aspect of the invention is to provide a method for making an electrode structure, wherein the electrode structure comprises at least one substrate, a plurality of electrodes disposed on the substrate, and at least one nano-wire originating from an edge of a first electrode and extending to an edge of a second electrode. The method comprises: providing the substrate; forming a plurality of electrodes on the substrate; growing the at least one nano-wire from the edge of the first electrode; and connecting the at least one nano-wire to the edge of the second electrode.

These and other aspects, advantages, and salient features of the present invention will become apparent from the following detailed description, the accompanying drawings, and the appended claims.

DETAILED DESCRIPTION OF THE INVENTION

Figure 1:
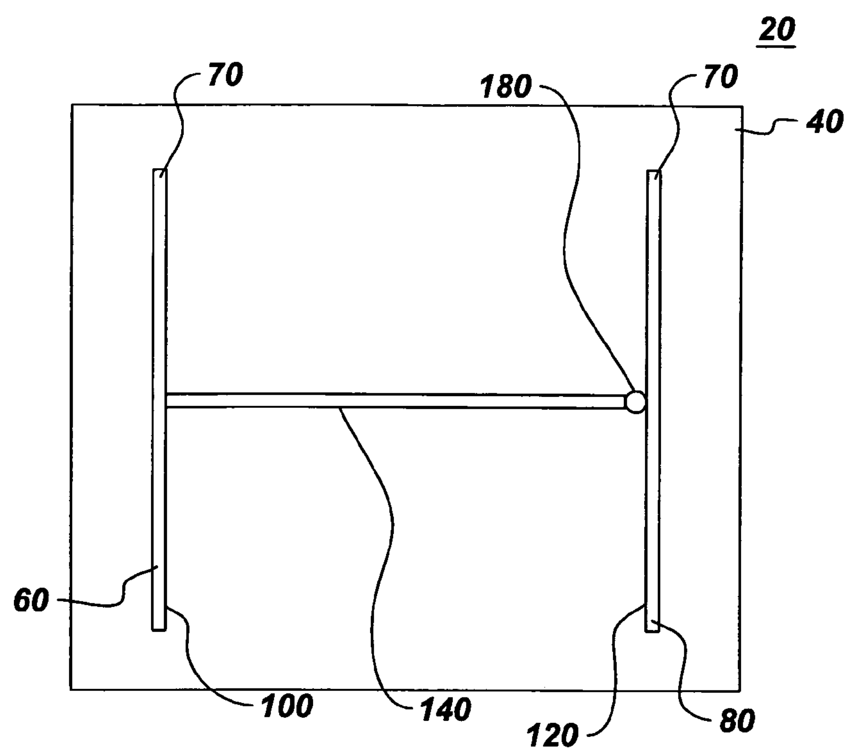
FIG. 1 is a schematic view of an electronic device of the present invention.

In the following description, like reference characters designate like or corresponding parts throughout the several views shown in the figures. It is also understood that terms such as "top," "bottom," "outward," "inward," and the like are words of convenience and are not to be construed as limiting terms.

The invention involves synthesis of inorganic nano-wires and nano-rods at the edge of lithographically defined structures on a substrate or a device. Within the scope of this invention, the terms "inorganic nano-wires" and "inorganic nano-tubes" are understood to include: any oxide, nitride, boride, or carbide of a metal, boron, or silicon; elemental and compound semiconductors; and metals.

Referring to the drawings in general and to FIG. 1 in particular, it will be understood that the illustrations are for the purpose of describing a preferred embodiment of the invention and are not intended to limit the invention thereto. Turning to FIG. 1, a schematic representation of an electronic device 20 of the present invention is shown. Among the electronic devices that fall within the scope of the present invention are core-shell structures, hetero-epitaxial nano-wires, GATE dielectric devices, biosensors, chemical sensors, cross-bar arrays, nano-electromechanical system (NEMS) devices, transistors, photo-detectors, light emitting diodes (LEDs), super-conducting devices, laser devices, combinations thereof, and the like. However, it will be appreciated by those skilled in the art that other electronic devices will fall within the scope of the invention.

One aspect of the present invention is to provide an electronic device 20. Electronic device 20 comprises at least one substrate 40; a plurality of electrodes 70 disposed on substrate 40; and at least one nano-wire 140 that grows from an edge 100 of a first electrode 60 to an edge 120 of a second electrode 80. In one embodiment, the at least one nano-wire 140 comprises a single crystal material. In another embodiment, the at least one nano-wire 140 comprises a polycrystalline material. In a third embodiment, nano-wire 140 comprises an amorphous material.

Substrate 40 comprises at least one of a semi-conducting material, an insulating material, and combinations thereof. In one embodiment, substrate 40 is a semi-conducting material comprising at least one of silicon, germanium, indium tin oxide, silicon carbide, and combinations thereof. In another embodiment, substrate 40 is an insulating material comprising at least one of diamond and a metal oxide. Non-limiting examples of such metal oxides include magnesium oxide, sapphire, lithium aluminate, and combinations thereof.

At least one electrode of first electrode 60 and second electrode 80 comprises at least one noble metal, such as, but not limited to, platinum, gold, silver, and combinations thereof. In another embodiment, the at least one electrode comprises at least one of tungsten, niobium, tantalum, and combinations thereof. In a third embodiment, at least one of first electrode 60 and second electrode 80 further includes a catalyst 180, wherein the catalyst 180 comprises at least at least one of gold, nickel, iron, chromium, cobalt, and combinations thereof.

The at least one nano-wire 140 comprises at least one of a semi-conductor, a carbide, an oxide, a nitride, a boride, and combinations thereof. In one embodiment, the at least one nano-wire comprises lanthanum hexaboride ($LaB_6$). In another embodiment, the at least one nano-wire 140 is a semi-conductor comprising at least one of silicon, germanium, a III-V compound, a II-VI compound, a IV-VI compound, and combinations thereof. In another embodiment, the at least one nano-wire 140 is a carbide comprising at least one of silicon carbide, niobium carbide, molybdenum carbide, tantalum carbide, hafnium carbide, tungsten carbide, and combinations thereof.

In one embodiment of the present invention, the at least one nano-wire 140 is oriented perpendicular to first electrode 60. In another embodiment, the at least one nano-wire 140 is oriented by at least one of an electric field, a magnetic field, and combinations thereof. In another embodiment, the at least one nano-wire 140 is oriented by a gas flow. Orientation of the at least one nano-wire 140 may take place during growth of the at least one nano-wire 140.

Figure 2:
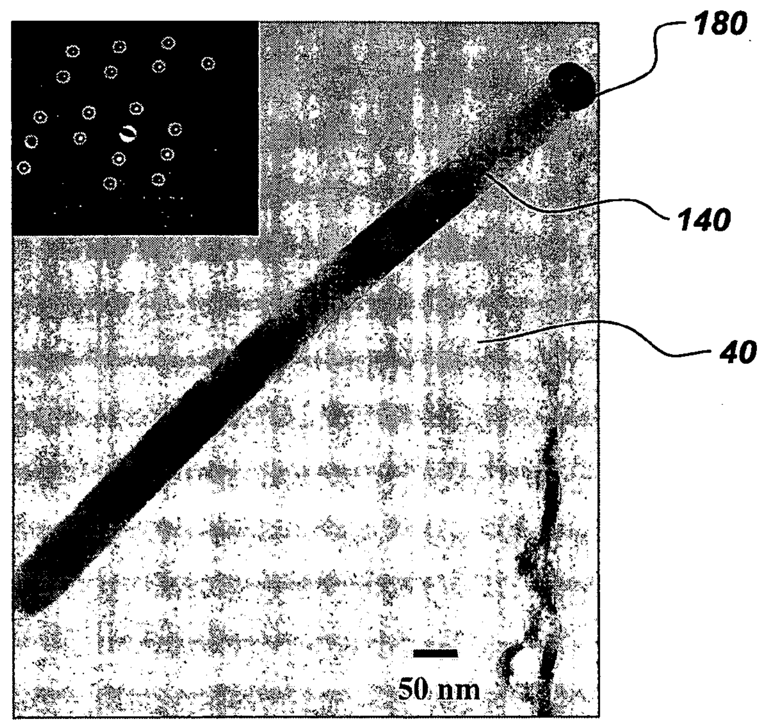
FIG. 2 is a micrograph of a nano-wire growing from a catalyst particle.

The at least one nano-wire 140 is coupled to and is grown from an edge 100 of first electrode 60. The at least on nano-wire 140 is grown from a portion of catalyst 180 disposed on edge 100 of first electrode 60. Catalyst 180 may be present as a particle or as a film deposited on first electrode 60. The at least one nano-wire grows from catalyst 180 via one of a vapor-solid and a vapor-liquid-solid (VLS) growth mechanism in which a particle of catalyst 180 acts as a seed for growing nano-wire 140. FIG. 2 is a micrograph of a nano-wire 140 growing from a particle of catalyst 180.

Figure 3:
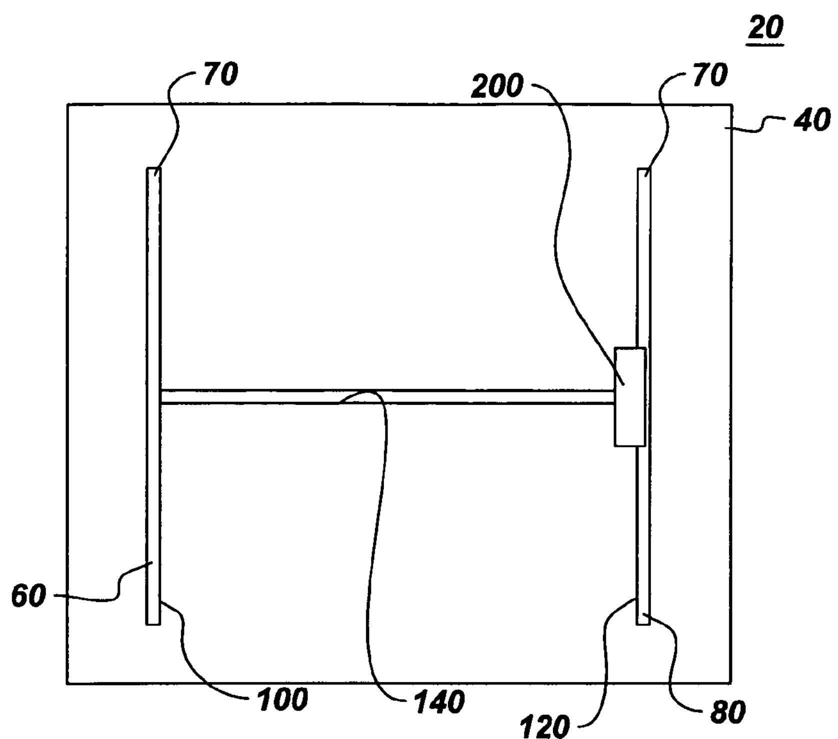
FIG. 3 is a schematic view of an electronic device of the present invention in which a nano-wire is coupled to a second electrode by a lithographically defined contact.

The at least one nano-wire 140 is coupled to second electrode 80. In one embodiment, the particle of catalyst 180 is attached to an end of the at least one nano-wire 140 during growth, and thus precedes the nano-wire 140 in its growth direction towards second electrode 80, where catalyst 180 serves as a terminal point for the at least one nano-wire 140 on second electrode 80 (FIG. 1). Alternatively, the at least one nano-wire 140 makes direct contact with second electrode 80. In yet another embodiment, shown in FIG. 3, the at least one nano-wire 140 is coupled to second electrode 80 by a lithographically defined contact 200 deposited after growth of the at least one nano-wire 140. Contact 200 comprises any suitable contact material, such as, but not limited to, a conductive metal, and may be deposited by physical vapor deposition means known in the art.

In one embodiment, the at least one nano-wire 140 is a nano-ribbon. In a third embodiment, the at least one nano-wire 140 is a cylindrical wire with a diameter in a range from about 5 nm to about 300 nm. More preferably, the at least one nano-wire 140 has a diameter in a range from about 5 nm to about 100 nm. In a fourth embodiment, the at least one nano-wire 140 has a length in a range from about 50 nm to about 50,000 nm. More preferably, nano-wire 140 has a length in a range from about 200 nm to about 20,000 nm.

Figure 6:
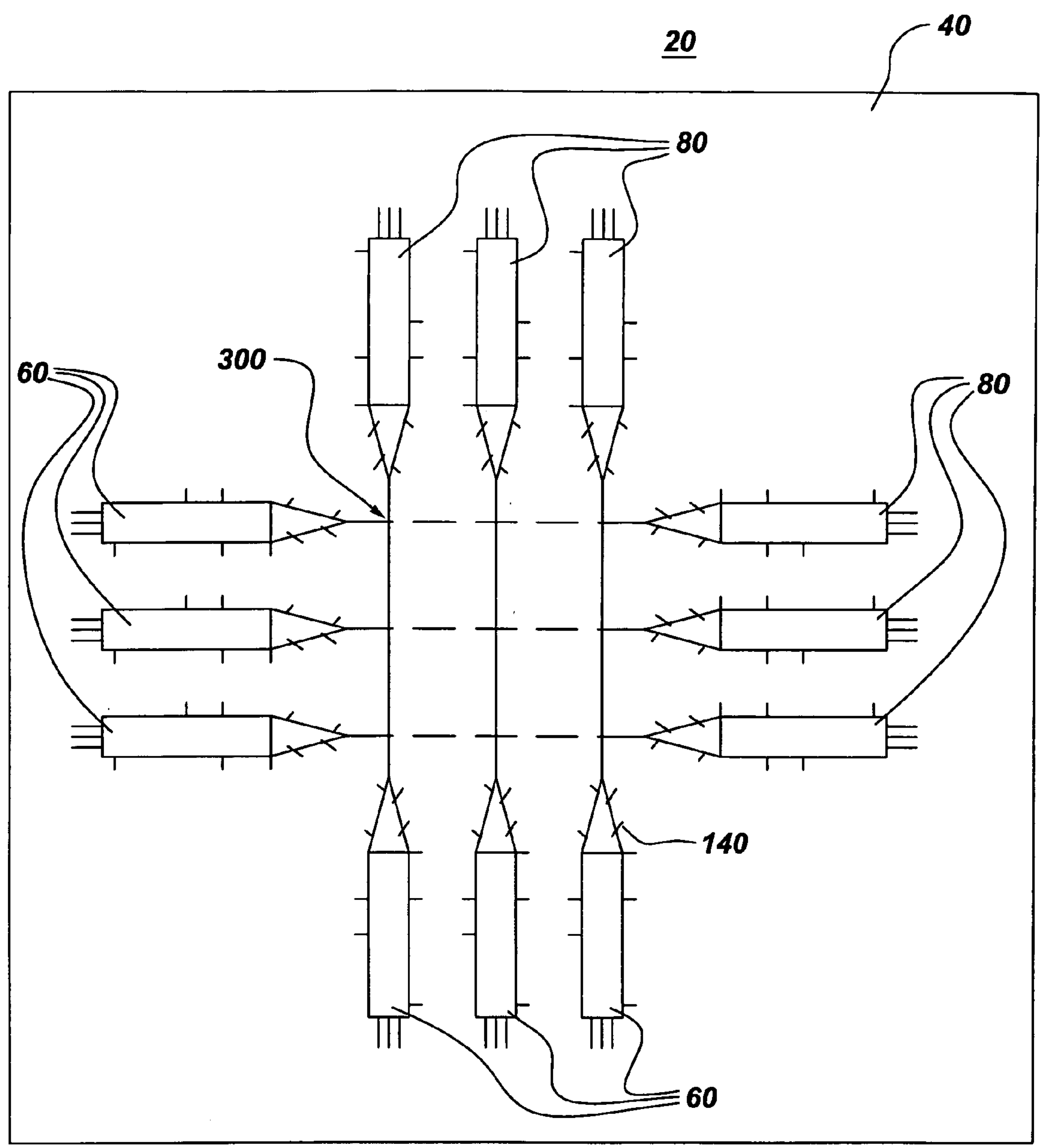
FIG. 6 is a schematic view of a cross-bar architecture of an array of nano-wires.

The plurality of electrodes 70 may be arrayed on substrate 40 and connected by the at least one nano-wire so as to provide an architecture for electronic device 20. A cross-bar architecture 300 is shown in FIG. 6.

Another aspect of the present invention is to provide an electrode structure comprising at least one electrode 70 having at least one edge portion 100 and at least one nano-wire 140 originating from edge portion 100. The at least one electrode 70, in one embodiment, comprises at least one noble metal, such as, but not limited to, platinum, gold, silver, and combinations thereof. In another embodiment, the at least one electrode comprises at least one of tungsten, niobium, tantalum, and combinations thereof. In a third embodiment, the at least one electrode includes a catalyst 180. The catalyst 180 comprises at least at least one of gold, nickel, iron, chromium, cobalt, and combinations thereof.

The at least one nano-wire 140 of the electrode structure comprises at least one of a semi-conductor, a carbide, an oxide, a nitride, a boride, and combinations thereof. In one particular embodiment, the at least one nano-wire 140 comprises lanthanum hexaboride ($LaB_6$). In another embodiment, nano-wire 140 comprises a semi-conductor. The semi-conductor comprises at least one of silicon, germanium, a III-V compound, a II-VI compound, a IV-VI compound, and combinations thereof. In another embodiment, nano-wire 140 comprises a carbide. The carbide comprises at least one of silicon carbide, niobium carbide, molybdenum carbide, tantalum carbide, hafnium carbide, tungsten carbide, and combinations thereof.

The at least one nano-wire 140 of the electrode structure may have a predetermined orientation with respect to the at least one electrode 70. For example, the at least one nano-wire 140 may be oriented perpendicular to the at least one electrode 70. External forces or fields may also be used, either during growth of nano-wire 140, or after growth of nano-wire 140, to orient the at least one nano-wire with respect to the electrode. In one embodiment, the at least one nano-wire is oriented by applying at least one of a magnetic field, an electric field, and combinations thereof.

The electrode structure can be used to build an array of nano-wires and electrodes, such as the cross-bar array 300 shown in FIG. 6. One application for such arrays is in memory devices and sensors.

Another aspect of the present invention is to provide a method for making an electrode structure for the electronic device 20 disclosed herein, wherein the electrode structure comprises at least one substrate 40, a plurality of electrodes 70 disposed on substrate 40, and at least one nano-wire 140 originating from edge 100 of first electrode 60 and extending to edge 120 of second electrode 80. The method comprises the steps of: providing substrate 40; forming a plurality of electrodes 70 on substrate 40; growing the at least one nano-wire 140 from an edge 100 of first electrode 60; and connecting the at least one nano-wire 140 to edge 120 of second electrode 80.

Substrate 40 comprises at least one of a semi-conducting material, an insulating material, and combinations thereof. The semi-conducting materials that may comprise the substrate include, but are not limited to, at least one of silicon, germanium, indium tin oxide, silicon carbide, combinations thereof, and the like. Non-limiting examples of insulating material include diamond and metal oxides, such as, but not limited to, at least one of magnesium oxide, sapphire, lithium aluminate, and combinations thereof.

In one embodiment of the present invention, the step of providing the substrate 40 further includes cleaning the substrate 40. In one embodiment substrate 40 is cleaned in a chemical bath (such as sulfuric acid) to obtain a thin native oxide film on the surface of the substrate. Alternatively, substrate 40 may be cleaned by other techniques that are known in the art, such as, but not limited to, plasma etching and the like.

Figure 4:
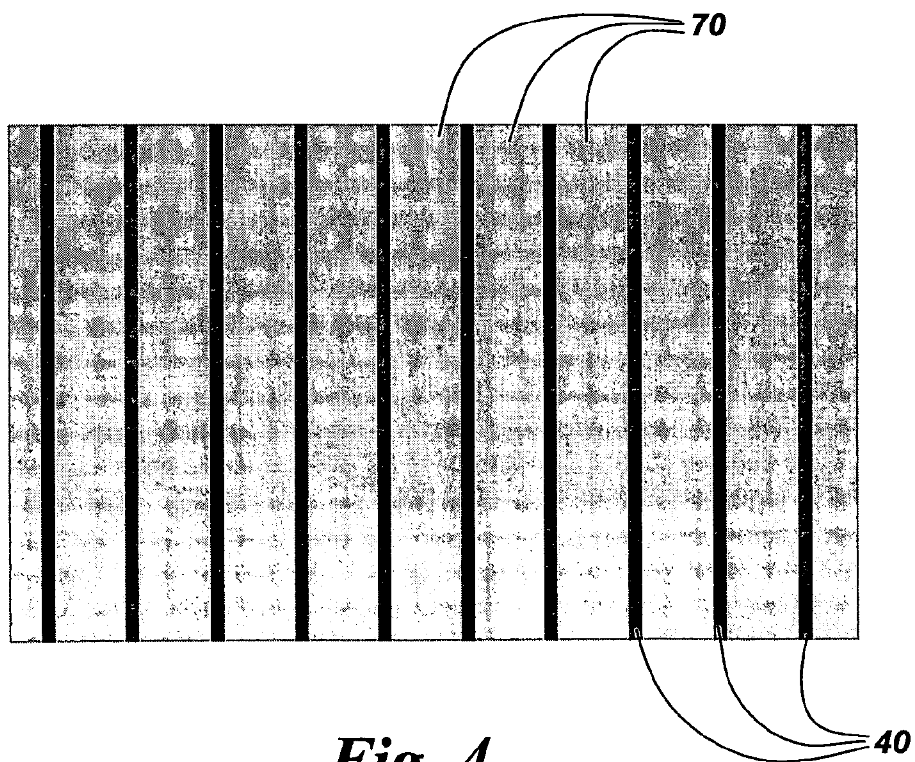
FIG. 4 is a micrograph showing an array of gold electrodes deposited on a silicon substrate.

In one embodiment, each of the plurality of electrodes 70 comprises at least one noble metal, such as, but not limited to, platinum, gold, silver, and combinations thereof. In another embodiment, each of the plurality of electrodes 70 comprises at least one of tungsten, niobium, tantalum, and combinations thereof. Alternatively, each of the plurality of electrodes 70 further comprises a catalyst 180, such as at least one of gold, nickel, iron, chromium, cobalt, combinations thereof, and the like. In one embodiment, the step of forming a plurality of electrodes 70 comprises spinning a photoresist onto substrate 40, defining patterns in the photoresist using photolithographic methods that are known in the art, and then removing portions of the patterned photoresist, leaving behind exposed portions of substrate 40. An ashing and/or buffered oxide etch process may be used to clean the exposed portions of substrate 40. Electrode material is then deposited on the exposed portions of substrate 40, using vapor deposition techniques that are known in the art, such as physical vapor deposition (PVD), and the like. Any remaining photoresist is then removed using lift-off techniques known in the art. An array of gold electrodes 70 deposited on a silicon substrate 40 by this method is shown in FIG. 4.

In another embodiment, a film of catalyst 180 is deposited on at least one of the plurality of electrodes 70. Catalyst 180 comprises at least one of gold, nickel, iron, chromium, cobalt, and combinations thereof. In one embodiment, catalyst 180 comprises at least one noble metal. The film of catalyst 180 has a thickness in a range from about 10 Angstroms to about 120 Angstroms. More preferably, the film of catalyst 180 has a thickness in a range from about 30 Angstroms to about 100 Angstroms. The film of catalyst 180 is deposited using at least one of electron-beam evaporation, laser ablation, radio frequency (rf) sputtering, plasma sputtering, molecular beam epitaxy, chemical vapor deposition, physical vapor deposition, metal organic chemical vapor deposition, and combinations thereof. Alternatively, catalyst may be deposited by spin-coating a slurry of nanoparticles of catalyst 180 onto a surface of the plurality of electrodes 70.

Figure 5:
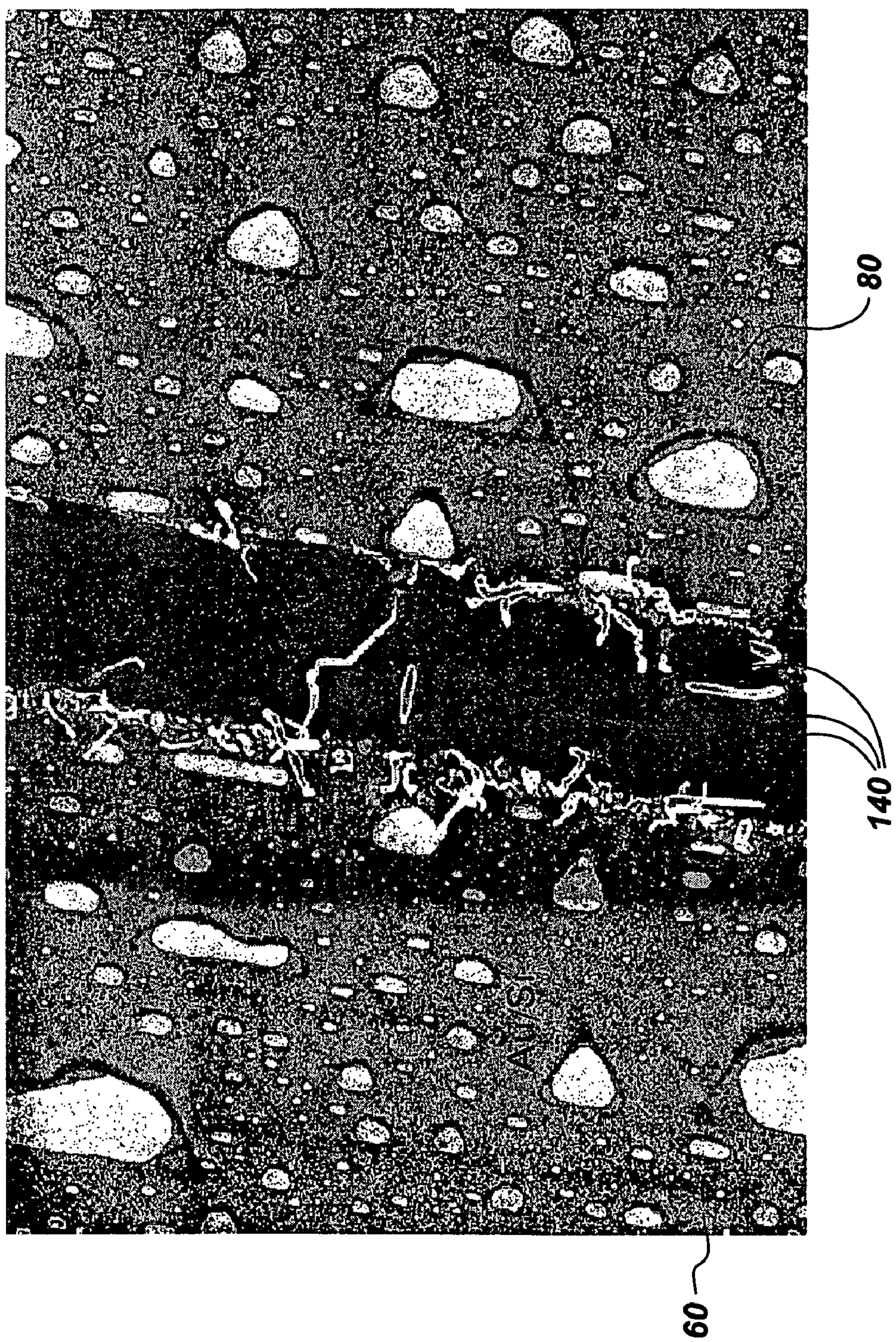
FIG. 5 is a micrograph showing a plurality of nano-wires grown from an electrode.

At least one nano-wire 140 is then grown from an edge of a first electrode 60. The at least one nano-wire 140 comprises at least one of a semi-conductor, a carbide, an oxide, a nitride, a boride, and combinations thereof. In one embodiment, the at least one nano-wire comprises a semi-conductor, wherein the semi-conductor comprises at least one of silicon, germanium, a III-V compound, a II-VI compound, a IV-VI compound, and combinations thereof. In another embodiment, the at least one nano-wire comprises 140 a carbide, wherein the carbide comprises at least one of silicon carbide, niobium carbide, molybdenum carbide, tantalum carbide, hafnium carbide, tungsten carbide, and combinations thereof. FIG. 5 is a micrograph showing a plurality of nano-wires 140 grown from first electrode 60 and extending toward second electrode 80.

In one embodiment of the present invention, the step of growing at least one nano-wire 140 from an edge of first electrode 60 comprises heating the electrode structure, which comprises substrate 40, plurality of electrodes 70 formed thereon, and catalyst 180 to a predetermined temperature in the presence of a metal containing vapor. The at least one nano-wire 140 grows from catalyst 180 via one of a vapor-solid and a vapor-liquid-solid (VLS) growth mechanism in which catalyst 180 acts as a seed for growing nano-wire 140. In one embodiment, the electrode structure is heated to a predetermined temperature in the presence of at least one additional reactive gas. The composition of the at least one additional reactive gas depends upon the desired composition of the plurality of nano-wires. In order to obtain nano-wires comprising a nitride, for example, the electrode structure is heated in the presence of ammonia and a metal-containing vapor. Similarly, the electrode structure is heated in the presence of ammonia and a metal-containing vapor oxygen to obtain oxide nano-wires. To obtain carbide nano-wires, the electrode structure is heated in the presence of a metal-containing vapor and at least one hydrocarbon, such as methane or the like, to obtain carbide nano-wires.

In one embodiment, the step of heating the electrode structure to a predetermined temperature comprises at least one heating period, a dwell time at the predetermined temperature, and a cooling period during which the metal vapor condenses on the electrode structure and the electrode structure is returned to room temperature. Heating and cooling of the electrode structure may be carried out at a controlled, predetermined rate. Multiple heating periods at different predetermined temperatures may also be used to grow the at least one nano-wire 140. The nano-wires may be grown by heating the electrode structure in a furnace such as a vacuum tube furnace, a muffle furnace, an annealing furnace, a controlled environment furnace, combinations thereof, and the like. The predetermined temperature that is used to grow the at least one nano-wire 140 depends on the desired composition of the at least one nano-wire. Generally, the at least one nano-wire 140 is grown at a temperature in a range from about 500° C. to about 1400° C. In another embodiment, the at least one nano-wire 140 is grown at a temperature in a range from 750° C. to about 1100° C. In one particular embodiment, the at least one nano-wire 140 is grown by heating the electrode assembly to a temperature of about 1200° C. The metal-containing vapor source comprises at least one of a semi-conductor, a carbide, an oxide, a nitride, a boride, a metal iodide, a metal bromide, a metal-organic liquid or vapor, a metal hydride, a metal chloride, a metal in elemental form, and combinations thereof.

The at least one nano-wire 140 grows from an edge of the first electrode 60, with catalyst 180 facilitating growth at the predetermined temperature in the presence of a metal containing vapor. The at least one nano-wire 140 may, in one embodiment, grow to and contact second electrode 80. Alternatively, a contact between the at least one nano-wire 140 and second electrode 80 is established by catalyst 180, which remains attached to the end of the at least one nano-wire 140, as shown in FIG. 1. Contact between the at least one nano-wire 140 and second electrode 80 can also be established by lithographically depositing a conductive element to establish contact between the at least one nano-wire 140 and second electrode 80, as shown in FIG. 1.

The following example is included to illustrate the various features and advantages of the present invention, and is not intended to limit the invention in any way.

EXAMPLE 1

In illustration, a silicon substrate (Si <111>) substrate is cleaned in a standard "piranha" or keros bath (sulfuric acid) to obtain a thin native oxide layer on the substrate. Photoresist is spun onto the substrate, patterns are defined thereon using photolithography, and the patterns are cleaned with an ashing and buffered oxide etch process to remove the native oxide in the patterns. Metallic gold (Au) having a thickness of 30–100 Å is deposited by electron-beam evaporation. The substrate is placed in a vacuum tube furnace with a metal vapor source for growing nano-rods. For growing zinc oxide nano-rods, ZnO is ground and mixed with carbon powder in a stoichiometric molar ratio of 1:1. While simple vapor transport by carbothermal reduction processes are used as the source for growing nano-rods, other techniques, such as laser ablation, evaporation, chemical vapor deposition (CVD), metal organic chemical vapor deposition (MOCVD), and combinations thereof are equally acceptable. In the case of ZnO, the furnace is heated to a temperature in range from about 890° C. to about 1000° C. for a time period ranging from about 1 minute to about 30 minutes and then allowed to cool. The actual dwell time period at the predetermined temperature is long enough to permit the at least one nano-wire 140 to grow to a length that is sufficient to connect first electrode 60 to second electrode 80, or to substantially cover the distance separating first electrode 60 from second electrode 80.

On cooling, the patterned feature breaks into "islands" with ZnO nano-rods found at the edge of these islands. The mechanism for the formation of the islands is believed to be selective diffusion of the Au catalyst into the underlying Si substrate except for the edge, that causes an etch step. The effect of a surface energy interaction with the native oxide at the edge of the patterns may also play a role in the process. Various strategies and approaches to engineer catalyst interaction for growing nano-wires and obtaining selective growth of nano-wires in precise locations is provided by the present invention. Various external fields, including well-defined gas flow, electric field, and magnetic fields applied in situ during synthesis are used to align the nano-wires across electrodes in configurations such as but not limited to core-shell structures, hetero-epitaxial nano-wires, GATE dielectric devices, biosensors, chemical sensors, artificial nose, cross-bar arrays and NEMS devices, and combinations thereof.

The method also provides for placement of nano-rods and nano-wires within a device architecture without having to independently synthesize the nano-rods and nano-wires. The invention is applicable to any suitable combination of substrate, catalyst, and nano-wire as may be known to one skilled in the art. Embodiments of the invention teach the growth of nano-wires at the edge of micron scale features for integration with larger scale structures; the devices and the fabrication processes for making the nano-wire; a cross-bar architecture 300 fabricated per the disclosed method as shown in FIG. 6, and the use of a bilayer nano-wire that is the selectively etched to make a NEMS device.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A method for making an electrode structure, wherein the electrode structure comprises at least one substrate, a plurality of electrodes disposed on the substrate, and at least one nano-wire originating from an edge of a first electrode and extending to an edge of a second electrode, the method comprising the steps of:

a) depositing a photoresist film onto a surface of the substrate;

b) defining a plurality of patterns on the photoresist film using photolithography;

c) cleaning the plurality of patterns with an etch process to leave a plurality of exposed portions of the substrate;

d) depositing an electrode material on the plurality of exposed portions of the substrate;

e) growing the at least one nano-wire from the edge of the first electrode; and f) connecting the at least one nano-wire to the edge of the second electrode.

2. The method according to claim 1, wherein the substrate comprises at least one of a semi-conducting material, an insulating material, and combinations thereof.

3. The method according to claim 2, wherein the semi-conducting material comprises at least one of silicon, germanium, indium tin oxide, silicon carbide, and combinations thereof.

4. The method according to claim 2, wherein the insulating material comprises at least one of a metal oxide and diamond.

5. The method according to claim 4, wherein the metal oxide comprises at least one of magnesium oxide, sapphire, lithium aluminate and combinations thereof.

6. The method according to claim 1, wherein the step of providing the substrate further includes cleaning the substrate.

7. The method according to claim 1, wherein the electrode material comprises at least one noble metal.

8. The method according to claim 7, wherein the at least one noble metal comprises at least one of platinum, gold, silver, and combinations thereof.

9. The method according to claim 1, wherein the electrode material has a thickness in a range from about 10 Angstroms to about 1000 Angstroms.

10. The method according to claim 9, wherein the electrode material has a thickness in a range from about 30 Angstroms to about 100 Angstroms.

11. The method according to claim 1, wherein the step of depositing the electrode material comprises depositing the catalyst using at least one of electron-beam evaporation, laser ablation, rf sputtering, plasma sputtering, molecular beam epitaxy, chemical vapor deposition, physical vapor deposition, metal organic chemical vapor deposition, and combinations thereof.

12. The method according to claim 1, wherein the plurality of electrodes comprises at least one of tungsten, niobium, tantalum, and combinations thereof.

13. The method according to claim 1, wherein the step of connecting the at least one nano-wire to the edge of the second electrode comprises coupling the at least one nano-wire to the second electrode by a lithographically patterned electrode film.

14. The method according to claim 1, wherein the at least one nano-wire is a nano-ribbon.

15. The method according to claim 1, wherein the at least one nano-wire has a diameter in a range from about 5 nm to about 300 nm.

16. The method according to claim 15, wherein the at least one nano-wire has a diameter in a range from about 5 nm to about 100 nm.

17. The method according to claim 1, wherein the at least one nano-wire has a length in a range from about 50 nm to about 50,000 nm.

18. The method according to claim 17, wherein the at least one nano-wire has a length in a range from about 200 nm to about 20,000 nm.

19. The method according to claim 1, wherein the electrode structure comprises a portion of at least one of a core-shell structure, a hetero-epitaxial nano-wire, a GATE dielectric device, a biosensor, a chemical sensor, an artificial nose, a cross-bar arrays, a nano-electromechanical system (NEMS) device, a transistor, a photo-detector, a light emitting diode (LED), a super-conducting device, a laser device, and combinations thereof.

* * * * *